US012342495B2

(12) United States Patent
Ruiz

(10) Patent No.: US 12,342,495 B2
(45) Date of Patent: Jun. 24, 2025

(54) ELECTRONICS ENCLOSURE WITH EXTENDABLE EQUIPMENT MOUNTS

(71) Applicant: Outdoor Wireless Networks LLC, Claremont, NC (US)

(72) Inventor: Guilibaldo Ruiz, McKinney, TX (US)

(73) Assignee: OUTDOOR WIRELESS NETWORKS LLC, Richardson, TX (US)

(*) Notice: Subject to any disclaimer, the term of this patent is extended or adjusted under 35 U.S.C. 154(b) by 271 days.

(21) Appl. No.: 17/234,886

(22) Filed: Apr. 20, 2021

(65) Prior Publication Data
US 2021/0410318 A1 Dec. 30, 2021

Related U.S. Application Data
(60) Provisional application No. 63/045,942, filed on Jun. 30, 2020.

(51) Int. Cl.
H05K 7/18 (2006.01)
H05K 7/14 (2006.01)

(52) U.S. Cl.
CPC .......... H05K 7/186 (2013.01); H05K 7/1401 (2013.01)

(58) Field of Classification Search
CPC ..... H05K 7/186; H05K 7/1401; H05K 7/1418
See application file for complete search history.

(56) References Cited

U.S. PATENT DOCUMENTS

| 6,552,915 B2* | 4/2003 | Takahashi | H05K 7/1418 361/752 |
| 7,684,208 B2* | 3/2010 | Okamoto | H05K 7/1487 361/801 |
| 8,054,632 B2* | 11/2011 | Regimbal | H05K 7/1489 361/679.33 |

(Continued)

FOREIGN PATENT DOCUMENTS

| JP | H06260780 A | 9/1994 |
| JP | 2005026372 A | 1/2005 |
| JP | 2005062569 A | 3/2005 |

OTHER PUBLICATIONS

"International Search Report and Written Opinion corresponding to International Application No. PCT/US2021/028286 mailed Aug. 6, 2021".

(Continued)

*Primary Examiner* — Imani N Hayman
*Assistant Examiner* — Hung Q Dang
(74) *Attorney, Agent, or Firm* — Myers Bigel, P.A.

(57) ABSTRACT

An electronics enclosure includes: a housing having a floor, a ceiling, a rear wall, a pair of side walls, and a door mounted to one of the side walls that define an internal cavity; a first generally vertically-disposed mounting blade; first electronic equipment mounted on the first mounting blade; and a first sliding mechanism mounted to the housing and to the first mounting blade, the sliding mechanism configured to permit the first mounting blade and the first electronic equipment to move between a retracted position, in which the first mounting blade is positioned in the internal cavity, and an extended position, in which the first mounting blade is positioned forwardly of the internal cavity to facilitate access to the first electronic equipment.

20 Claims, 17 Drawing Sheets

(56) References Cited

U.S. PATENT DOCUMENTS

| 8,054,645 B2* | 11/2011 | Ikeda | H05K 7/1461 |
| | | | 361/802 |
| 8,582,306 B2* | 11/2013 | Hamand | G06F 1/181 |
| | | | 361/732 |
| 9,055,691 B2* | 6/2015 | Doglio | H05K 7/1489 |
| 10,278,298 B2* | 4/2019 | De Vis | H05K 5/0226 |
| 2002/0006026 A1 | 1/2002 | Takahashi et al. | |
| 2007/0091550 A1* | 4/2007 | Smith | H05K 7/1488 |
| | | | 361/679.02 |
| 2007/0127204 A1* | 6/2007 | Muenzer | G06F 1/181 |
| | | | 361/679.58 |
| 2009/0015120 A1 | 1/2009 | Newhouse et al. | |

OTHER PUBLICATIONS

"International Preliminary Report on Patentability corresponding to International Application No. PCT/US2021/028286 mailed Jan. 12, 2023".

* cited by examiner

ELECTRONICS ENCLOSURE WITH EXTENDABLE EQUIPMENT MOUNTS

RELATED APPLICATION

The present application claims priority from and the benefit of U.S. Provisional Patent Application No. 63/045,942, filed Jun. 30, 2020, the disclosure of which is hereby incorporated herein in its entirety.

FIELD OF THE INVENTION

The present invention relates generally to enclosures, and more specifically to electronics enclosures.

BACKGROUND

Outdoor electronics enclosures have become popular in recent years. They can protect a wide range of electronic equipment including radios, multicarrier power amplifiers (MCPA), power suppliers, batteries, and wireless cell site backhaul equipment. These enclosures can protect base station equipment from environmental conditions while minimizing operating expenses and energy consumption.

Typically, electronics enclosures include one or two doors mounted to the front of the enclosure to provide access to components positioned within the front portion of the enclosure. Current enclosures have mounting shelves or brackets, such that equipment is mounted or stacked above/below other equipment. When removing equipment stored in the rear of the enclosure, front equipment and/or brackets may need to be removed to permit access. This re-arranging of equipment can be very time consuming.

SUMMARY

As a first aspect, embodiments of the invention are directed to an electronics enclosure. The electronics enclosure comprises: a housing having a floor, a ceiling, a rear wall, a pair of side walls, and a door mounted to one of the side walls that define an internal cavity; a first generally vertically-disposed mounting blade; first electronic equipment mounted on the first mounting blade; and a first sliding mechanism mounted to the housing and to the first mounting blade. The sliding mechanism is configured to permit the first mounting blade and the first electronic equipment to move between a retracted position, in which the first mounting blade is positioned in the internal cavity, and an extended position, in which the first mounting blade is positioned forwardly of the internal cavity to facilitate access to the first electronic equipment.

As a second aspect, embodiments of the invention are directed to an electronics enclosure comprising: a housing having a floor, a ceiling, a rear wall, a pair of side walls, and a door mounted to one of the side walls that define an internal cavity; a first generally vertically-disposed mounting blade; a second generally vertically-disposed mounting blade; first electronic equipment mounted on the first mounting blade; second electronic equipment mounted on the second mounting blade; a first sliding mechanism mounted to the housing and to the first mounting blade, the first sliding mechanism configured to permit the first mounting blade and the electronic equipment to move between a retracted position, in which the first mounting blade is positioned in the internal cavity, and an extended position, in which the first mounting blade is positioned forwardly of the internal cavity to facilitate access to the first electronic equipment; and a second sliding mechanism mounted to the housing and to the second mounting blade, the second sliding mechanism configured to permit the second mounting blade and the second electronic equipment to move between a retracted position, in which the second mounting blade is positioned in the internal cavity, and an extended position, in which the second mounting blade is positioned forwardly of the internal cavity to facilitate access to the second electronic equipment.

As a third aspect, embodiments of the invention are directed to an electronics enclosure comprising: a housing having a floor, a ceiling, a rear wall, a pair of side walls, and a door mounted to one of the side walls that define an internal cavity; a first generally vertically-disposed mounting blade; a second generally vertically-disposed mounting blade; first electronic equipment mounted on the first mounting blade; second electronic equipment mounted on the second mounting blade; a first sliding mechanism mounted to the housing and to the first mounting blade, the first sliding mechanism configured to permit the first mounting blade and the electronic equipment to move between a retracted position, in which the first mounting blade is positioned in the internal cavity, and an extended position, in which the firs mounting blade is positioned forwardly of the internal cavity to facilitate access to the first electronic equipment; a second sliding mechanism mounted to the housing and to the second mounting blade, the second sliding mechanism configured to permit the second mounting blade and the second electronic equipment to move between a retracted position, in which the second mounting blade is positioned in the internal cavity, and an extended position, in which the second mounting blade is positioned forwardly of the internal cavity to facilitate access to the second electronic equipment; a first locking mechanism that releasably locks the first mounting blade in the retracted position; and a second locking mechanism that releasably locks the second mounting blade in the retracted position.

DETAILED DESCRIPTION

Figure 1:
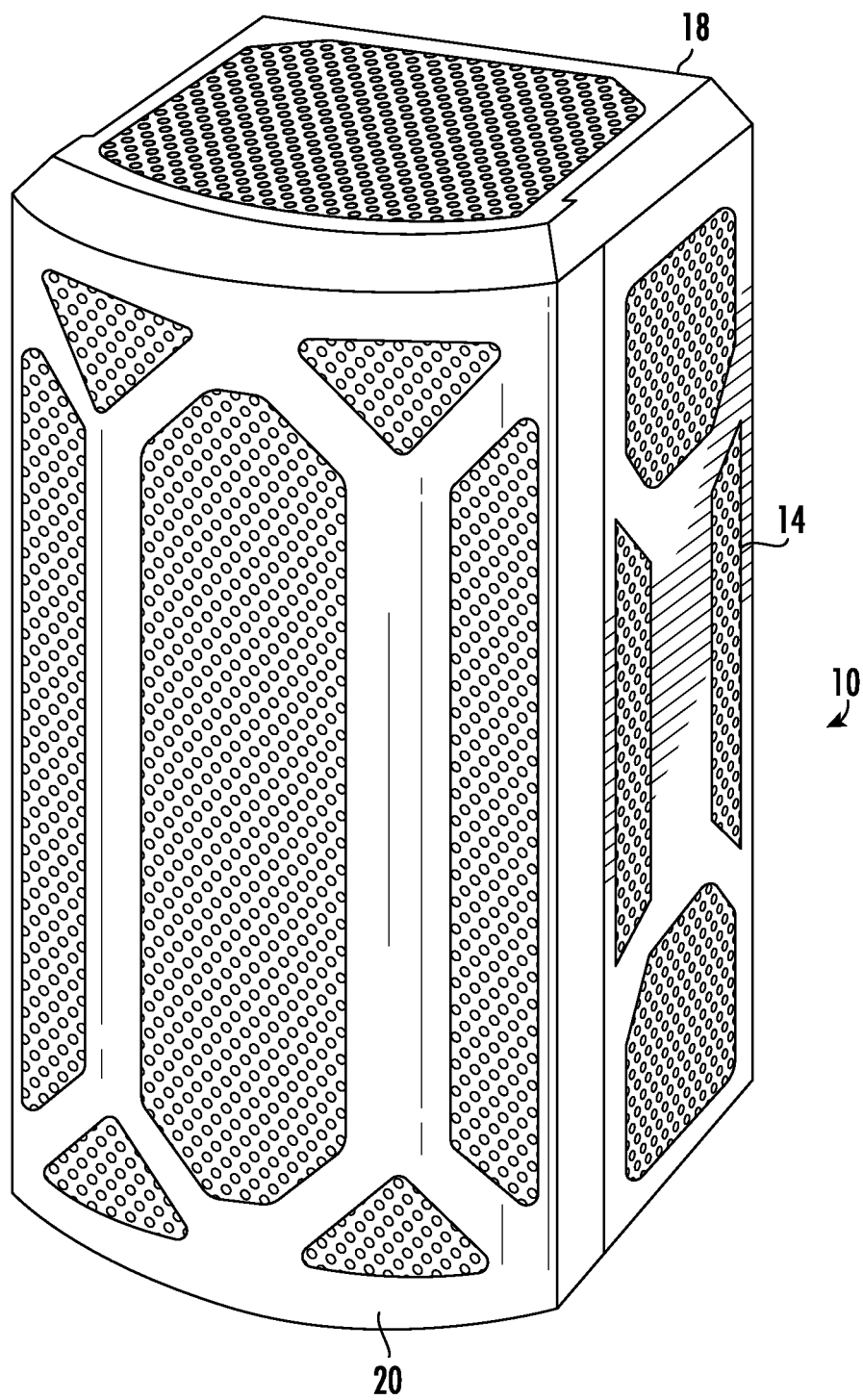
FIG. 1 is a front perspective view of an electronics enclosure according to embodiments of the invention.

The present invention is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

It will also be understood that, as used herein, the terms "example," "exemplary," and derivatives thereof are intended to refer to non-limiting examples and/or variants embodiments discussed herein, and are not intended to indicate preference for one or more embodiments discussed herein compared to one or more other embodiments.

Figure 3A:
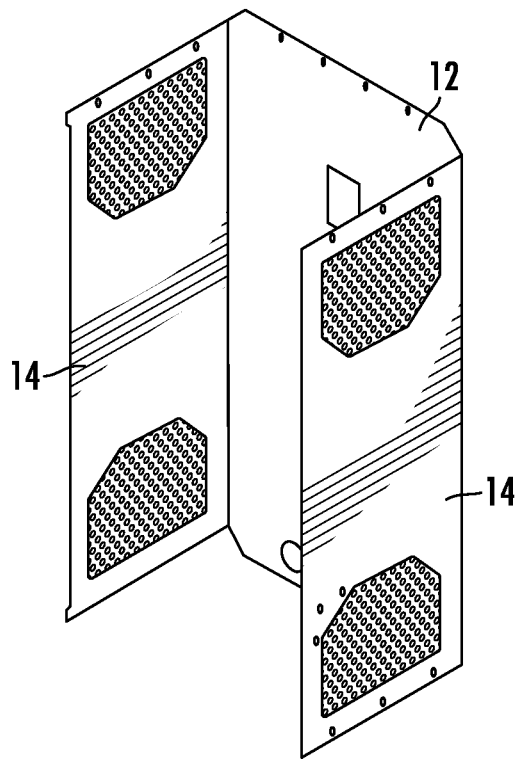
FIGS. 3A and 3B are rear perspective views of the rear and side walls of the enclosure of FIG. 1.
Figure 3B:
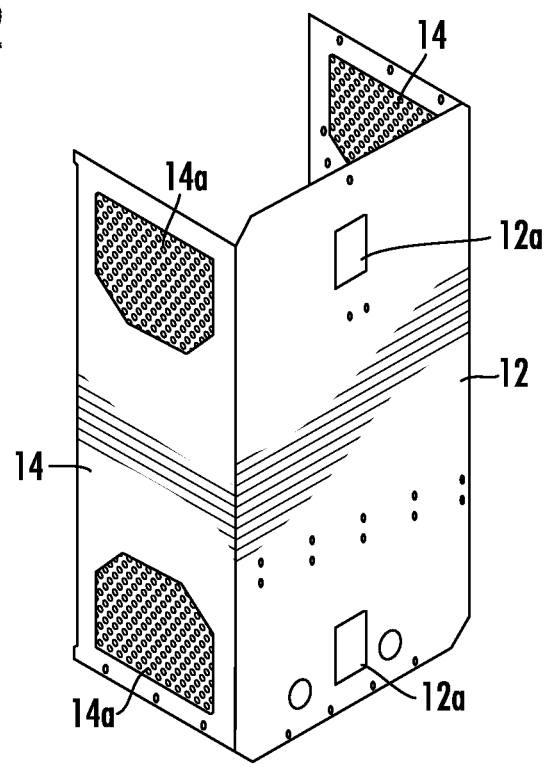
Figure 4:
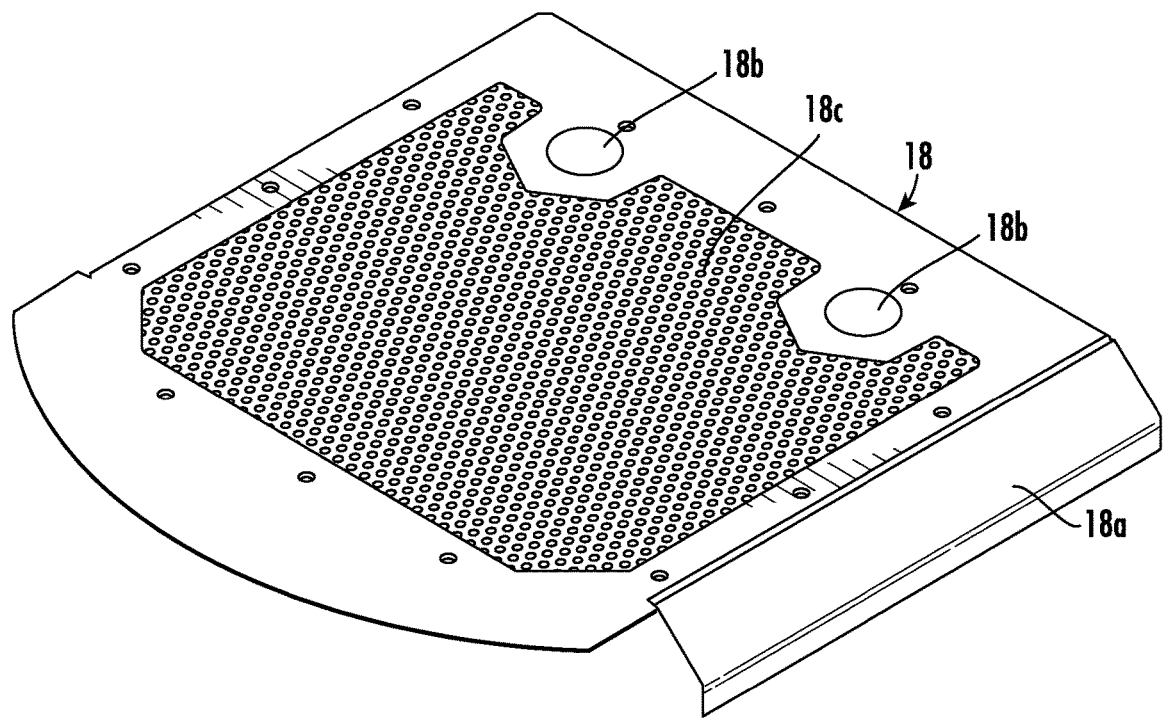
FIG. 4 is a front perspective view of the ceiling of the enclosure of FIG. 1.
Figure 5:
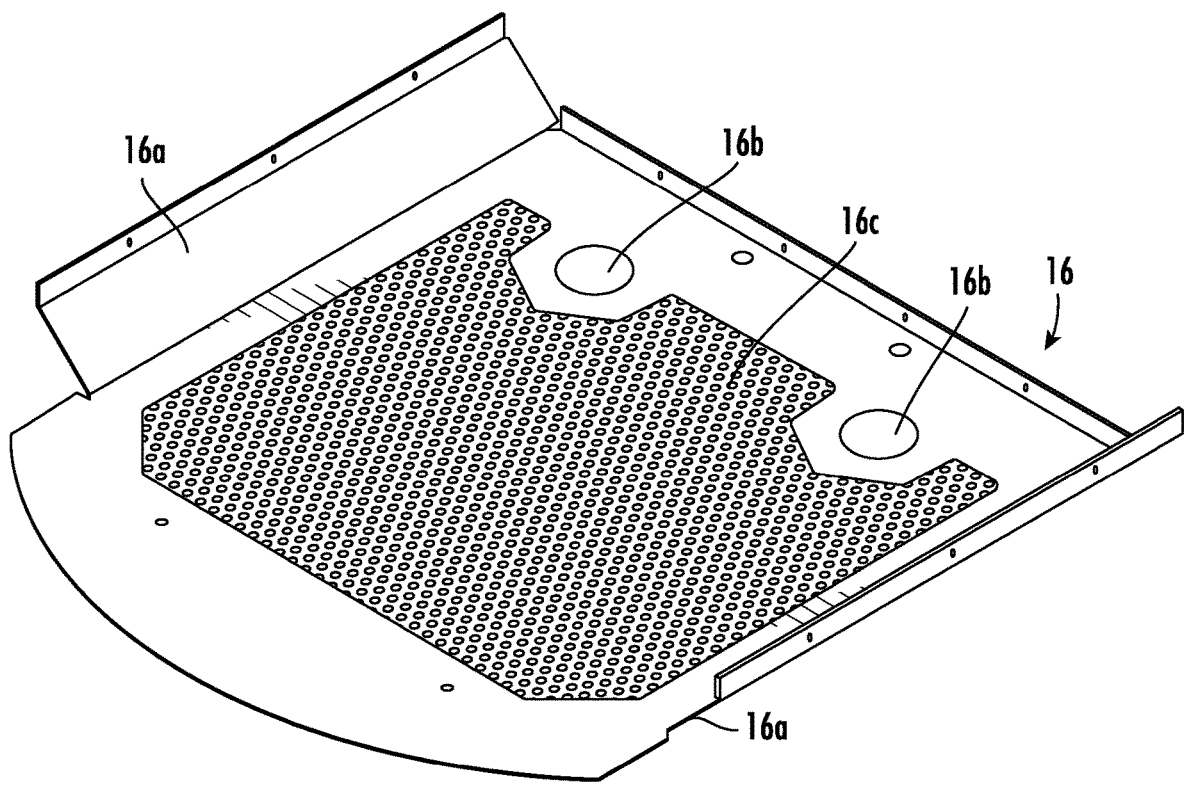
FIG. 5 is a front perspective view of the floor of the enclosure of FIG. 1.

Referring now to the figures, an electronics enclosure, designated broadly at 10, is shown in FIGS. 1-13. The enclosure 10 is an enclosure with a rear wall 12, side walls 14, a floor 16 and a ceiling 18. As shown in FIG. 3, in the illustrated embodiment the side walls 14 and rear wall 12 are formed as a single monolithic component. The rear wall 12 includes two knockout sections 12a that may be employed for cable routing, as well as other holes for mounting of components. Each of the side walls 14 optionally includes one or more perforated areas 14a. The ceiling 18 is shown in FIG. 4 and includes beveled side edges 18a. The upper panel of the ceiling 18 may include knockout sections 18b and/or a perforated section 18c. Likewise, the floor 16 has beveled edges 16a, a perforated section 16c and knockout areas 16b. The floor 16, side walls 14, ceiling 18 and rear wall 12 define an interior cavity 19 (shown in FIG. 13). These structures are typically formed of a metallic material, such as steel.

Figure 6:
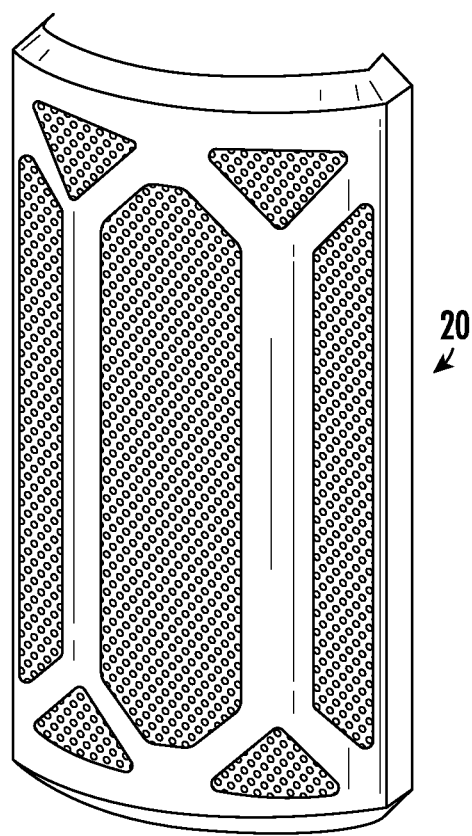
FIG. 6 is a front perspective view of the door of the enclosure of FIG. 1.

A door 20 (FIGS. 1 and 6) is pivotally attached to one of the side walls 14. As seen in FIG. 6, the door 20 has an arcuate profile. The arcuate profile can enable the enclosure 10 to store more or larger equipment and/or mounting components, including those described below.

Figure 2:
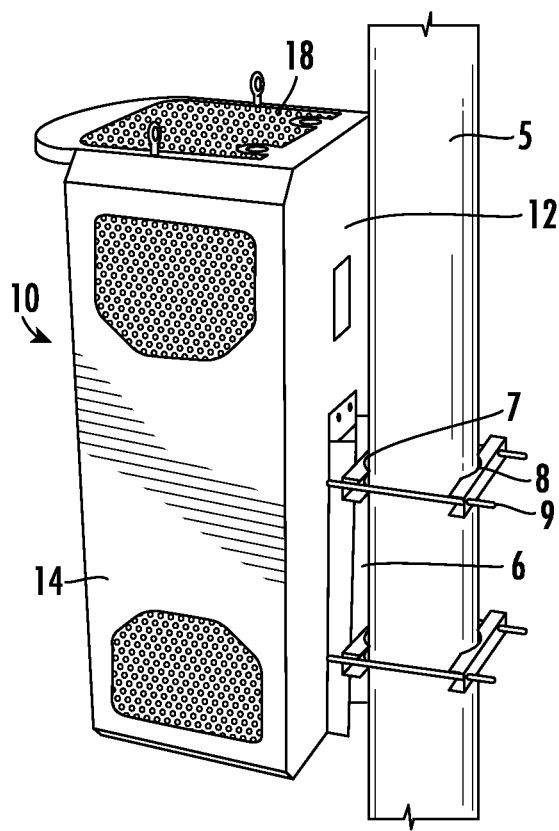
FIG. 2 is a rear perspective view of the enclosure of FIG. 1 mounted on a pole.

FIG. 2 illustrates how the enclosure 10 may be mounted on a mounting structure 5, such as a monopole, power pole, antenna tower, etc. A bracket 6 is mounted to the rear wall 12, and clamps 7 attached to the bracket 6 are employed with mating clamps 8 and threaded rods 9 to clamp the enclosure 10 to the structure 5.

Figure 7:
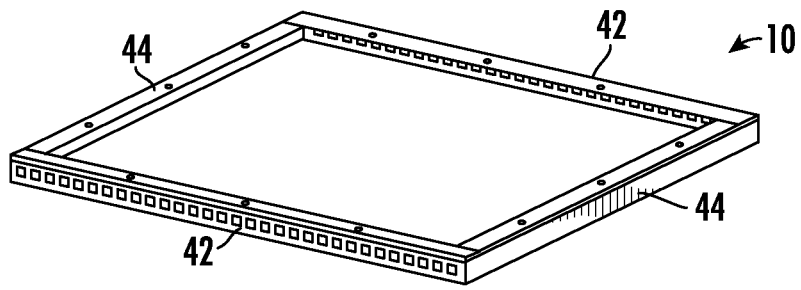
FIG. 7 is a front perspective view of the upper framework of the enclosure of FIG. 1.
Figure 8:
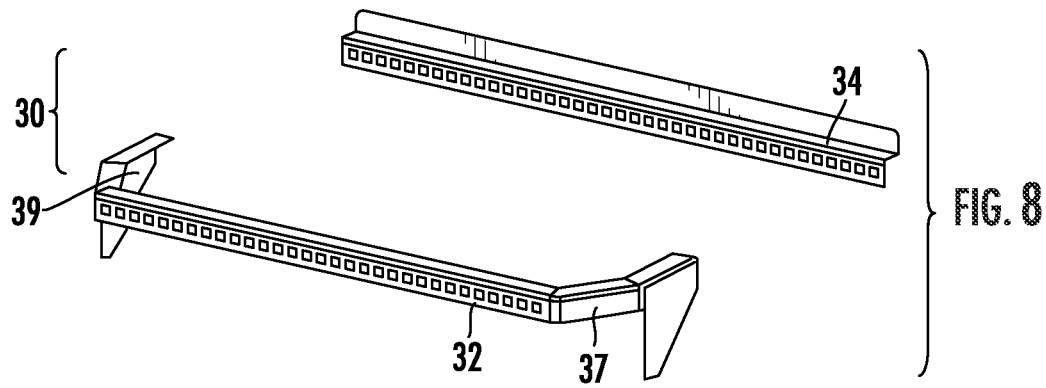
FIG. 8 is a front perspective view of the front and rear cross-members of the enclosure of FIG. 1.
Figure 13:
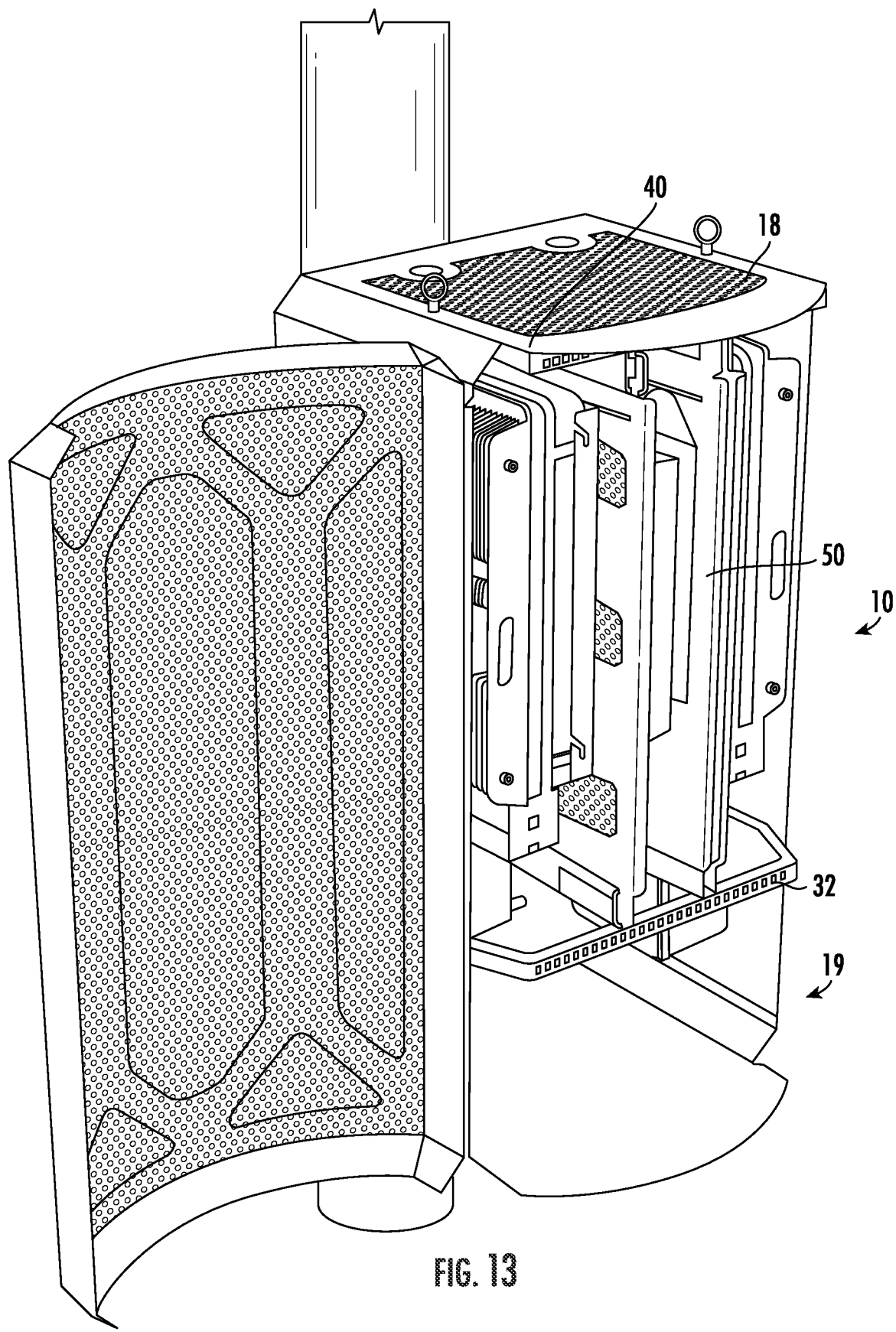
FIG. 13 is a front perspective view of the enclosure of FIG. 1 with the door open and equipment in a retracted position.

Referring now to FIGS. 8 and 13, it can be seen that in the interior cavity 19, a foundation 30 for the mounting of mounting blades 50 is mounted therein. The foundation 30 includes front and rear cross-members 32, 34 (FIG. 8). The front cross-member 32 includes short, angled transition sections 37, 39 at its ends that mount onto the side walls 14. The rear cross-member 34 is mounted to the rear wall 12 and is spaced above the floor 16. As shown in FIG. 7, an upper, generally square framework 40 having cross-members 42 and longitudinal members 44 is mounted on the underside of the ceiling 18.

Figure 9:
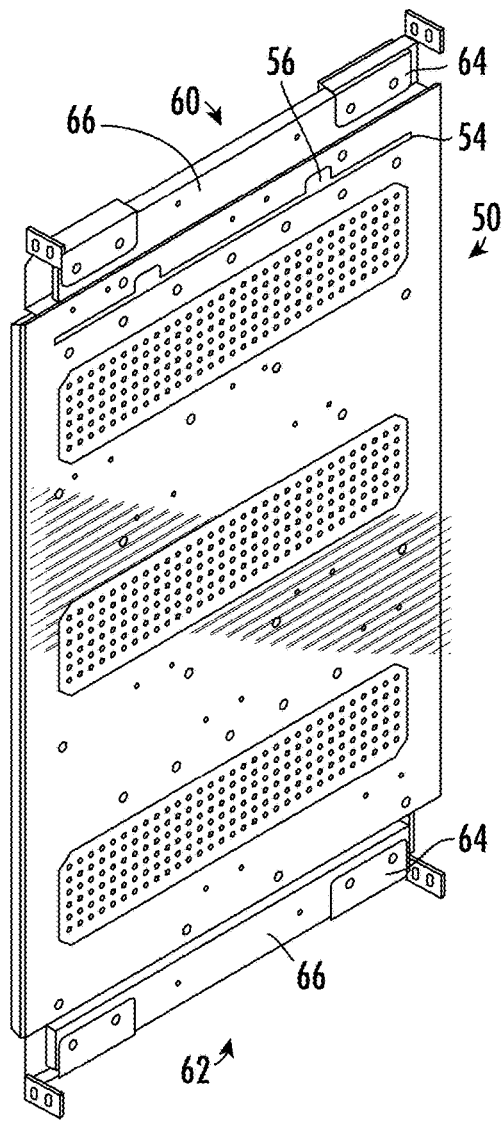
FIG. 9 is a front perspective view of a mounting blade and upper and lower slide rails of the enclosure of FIG. 1.
Figure 10:
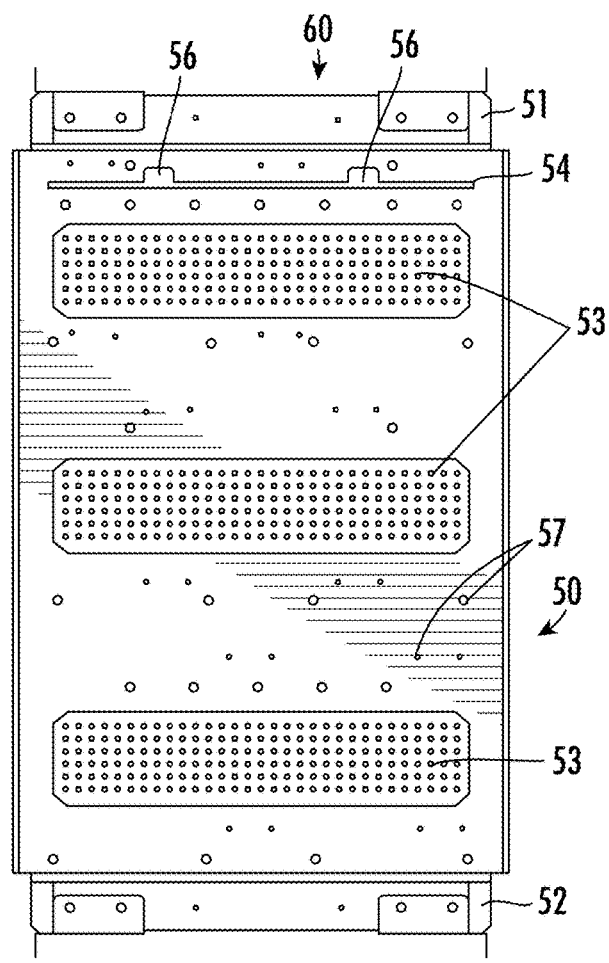
FIG. 10 is a side view of the mounting blade and upper and lower slide rails of the enclosure of FIG. 1.
Figure 11:
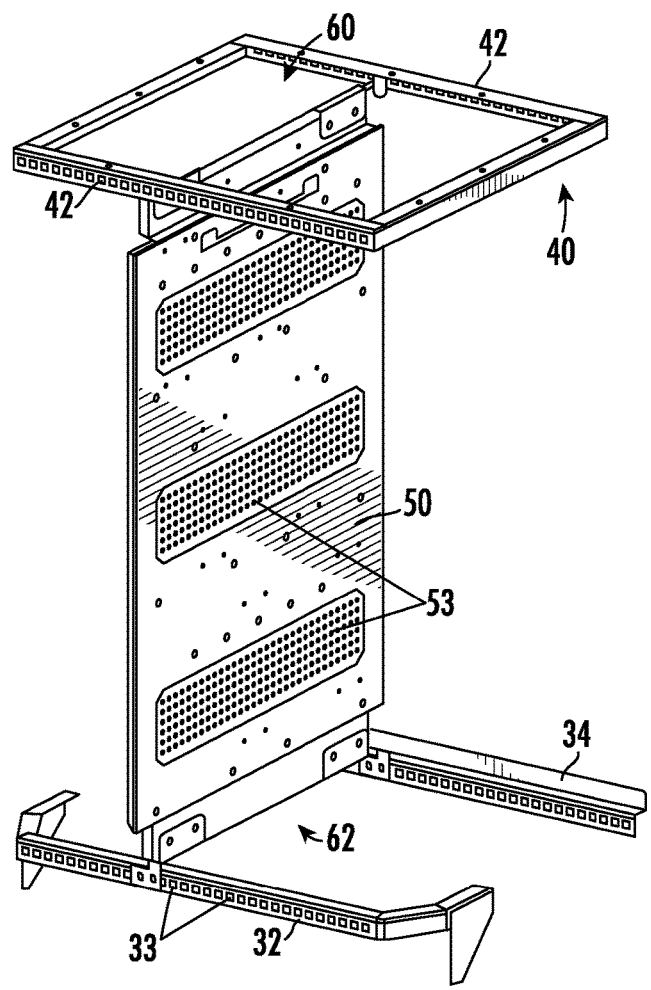
FIG. 11 is a front perspective view of the mounting blade of FIG. 9 slidably mounted to the upper framework and front and rear cross-members of the enclosure of FIG. 1.
Figure 12:
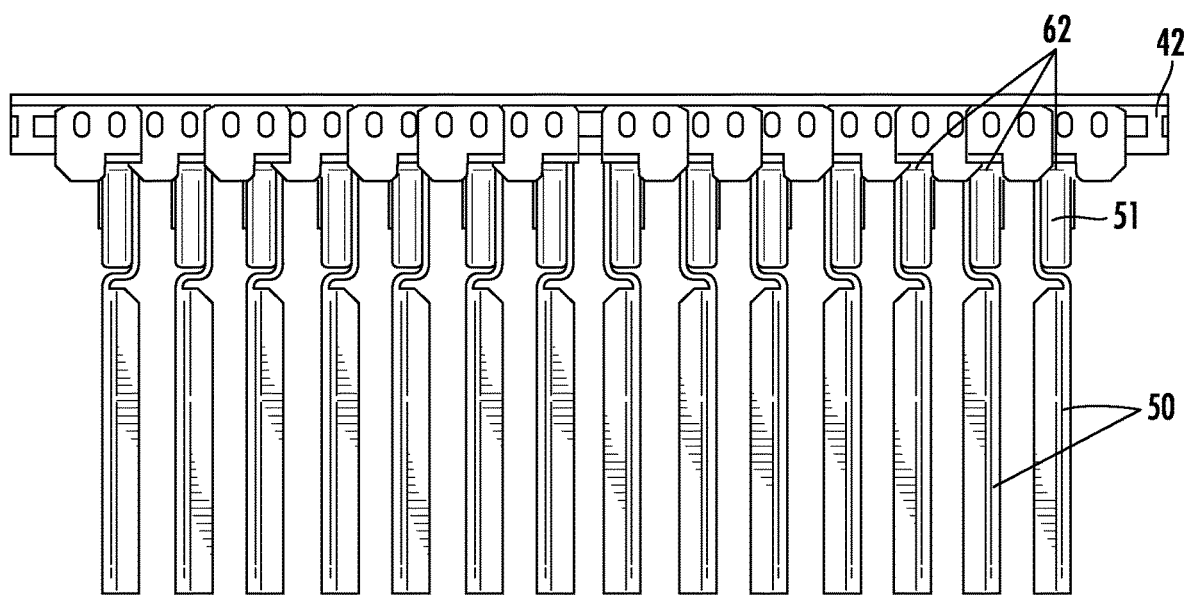
FIG. 12 is a greatly enlarged partial front view of multiple mounting blades of FIG. 9 mounting to the upper framework.

As can be seen in, for example, FIGS. 11 and 12, a plurality of sets of upper and lower slide rails 60, 62 are mounted to, respectively, the cross-members 42 of the framework 40 and the front and rear cross-members 32, 34 of the foundation 30. Mounting blades 50 are mounted to the upper and lower slide rails 60, 62. An exemplary mounting blade 50, upper slide rail 60 and lower slide rail 62 are shown in FIGS. 9 and 10. Each of the slide rails 60, 62 typically includes a stationary member 64 that is fixed to either the foundation 30 or the framework 40, and a slide member 66 that is slidably connected with the stationary member 64. The slide rails 60, 62 may be of conventional construction and need not be described in detail herein. It is also contemplated that the slide rails 60, 62 may be mounted in different transverse locations within the interior 19, such that the cross-members 32, 34, 42 may have several different sets of mounting holes (see holes 33 in the front cross-member 32 in FIG. 11) that can be used to mount the slide rails 60, 62 in the different positions.

As can also be seen in FIGS. 9 and 10, each mounting blade 50 is generally rectangular and includes a number of holes 57 in various patterns for the mounting of mounting brackets and equipment. As can be seen in FIG. 12, the upper and lower edges of each mounting blade 50 have offset flanges 51, 52 that facilitate attachment of the mounting blade 50 to the slide members 66 of the slide rails 60, 62. Also, near its upper edge, each mounting blade 50 has a horizontal slot 54 with cutouts 56 that facilitates mounting of a mounting bracket 70 thereon. The mounting blade 50 has three cutouts or perforated areas 53 to provide ventilation.

Figure 15:
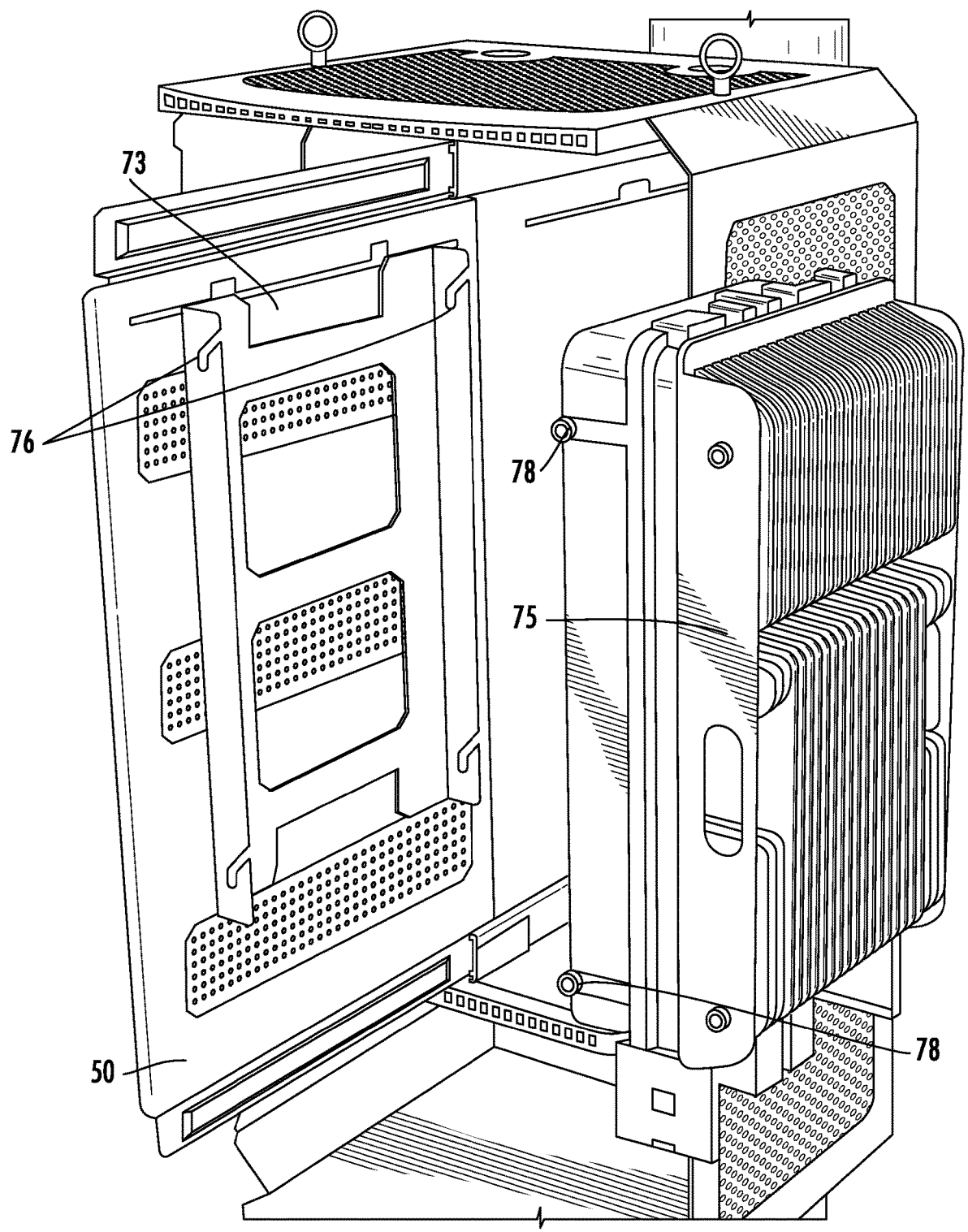
FIG. 15 is a front perspective view of the hanger plate of FIG. 14 mounted on a mounting blade in the enclosure of FIG. 1, with a radio to be mounted thereon in exploded view.
Figure 17:
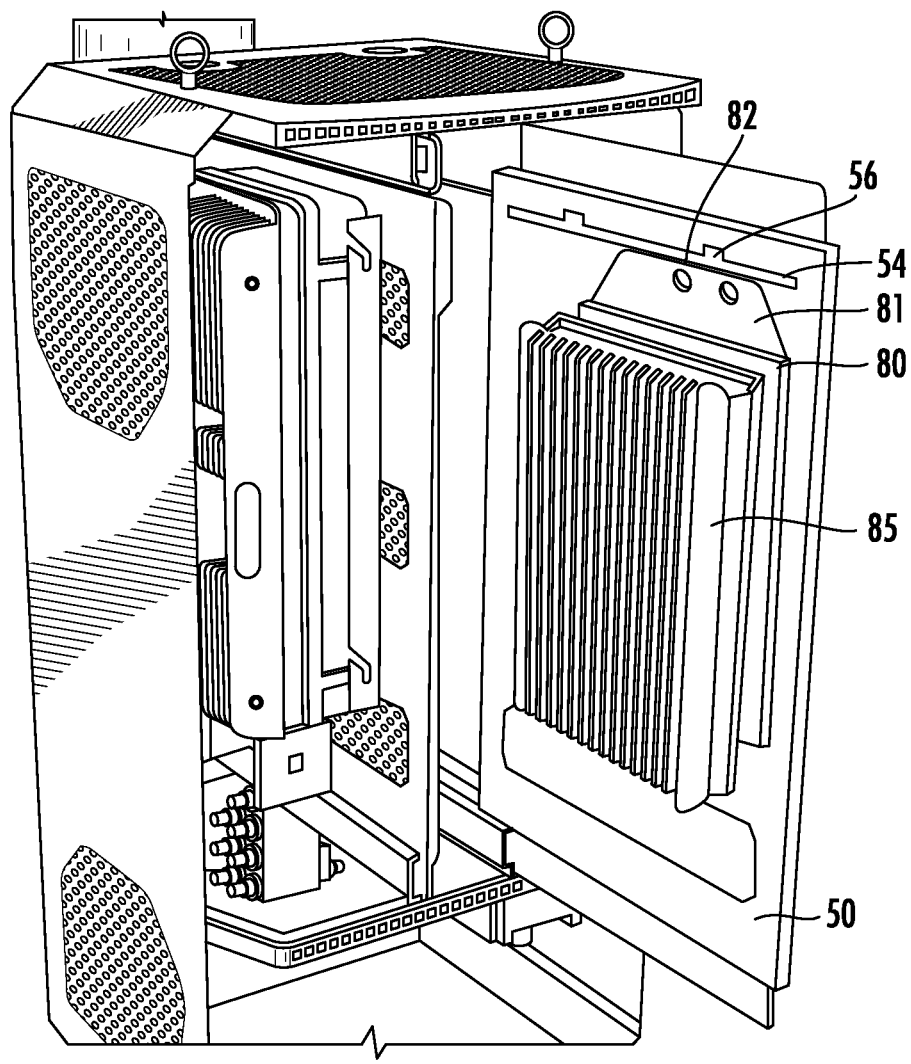
FIG. 17 is a front perspective view of the hanger plate of FIG. 16 mounted on a mounting blade, with a radio mounted thereon, in a enclosure of FIG. 1.

Once the mounting blades 50 are mounted on respective pairs of upper and lower slide rails 60, 62, the mounting blades 50 can be moved from a retracted position (shown in FIG. 13) to an extended position in front of the enclosure (see, e.g., FIGS. 15 and 17). In this extended position, a technician may have greater/easier access to equipment mounted on the mounting blades 50.

Figure 14:
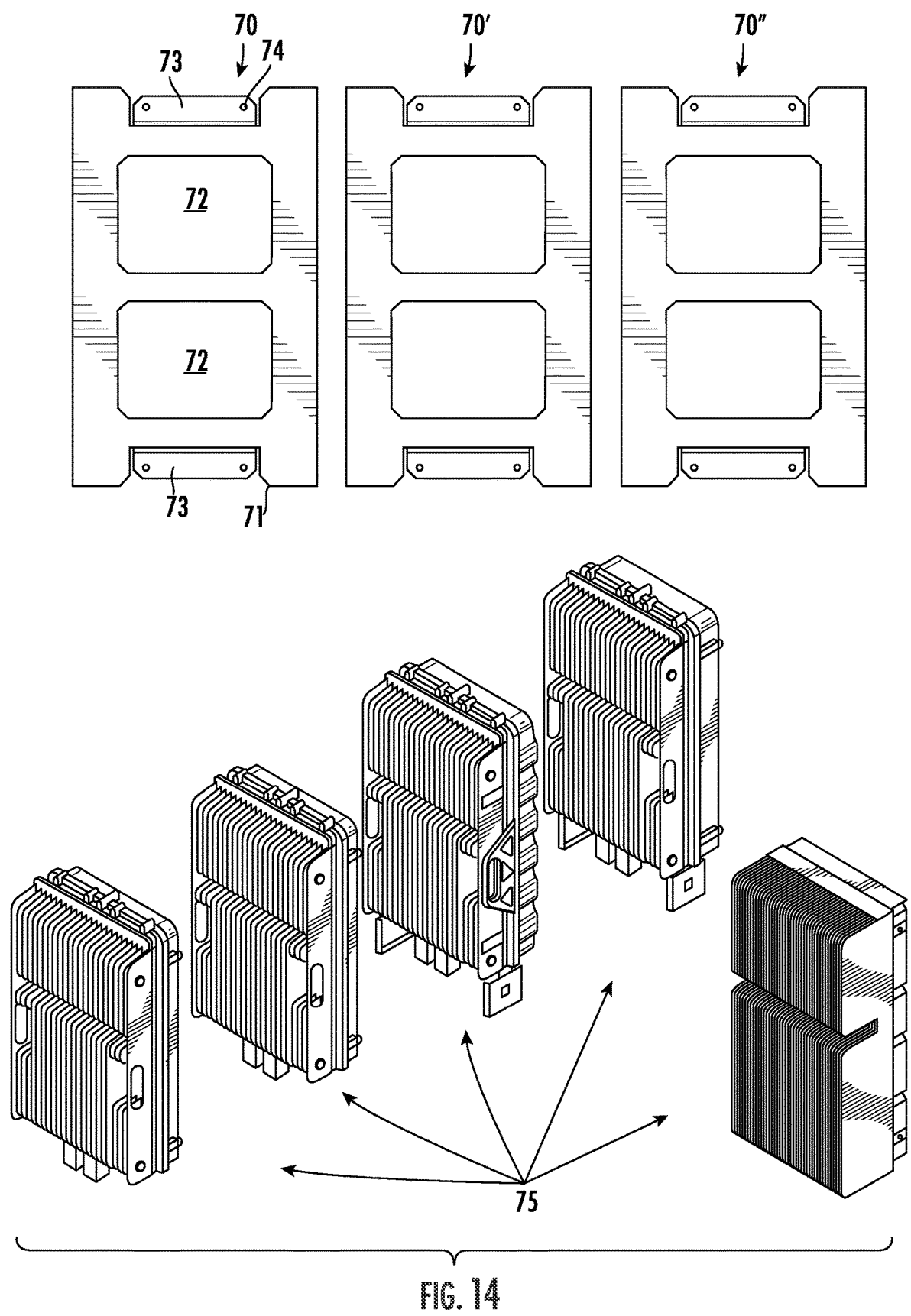
FIG. 14 is a front view of exemplary hanger plates to be used with multiple models of radios in the enclosure of FIG. 1.

FIG. 14 illustrates three different mounting brackets 70, 70', 70" that may be used to mount a line of radio models 75 (e.g., Nokia radios). Each of the mounting brackets 70, 70', 70" includes a skeletal frame 71 with two cutouts 72. Offset flanges 73 include mounting holes 74 that are used to mount the brackets 70, 70', 70" to a mounting blade 50. As can be seen in FIG. 15, each of the mounting brackets 70, 70', 70" has open ended slots 76 in side walls 77 that receive pins/posts 78 on the radios 75. Thus, a technician can first mount the mounting bracket 70, 70', 70" of choice onto a mounting blade 50 via fasteners inserted into the holes 74, then simply slide the posts 78 on the radio 75 into the slots 76 to mount the radio 75 in the enclosure 10 (see FIG. 16).

Figure 16:
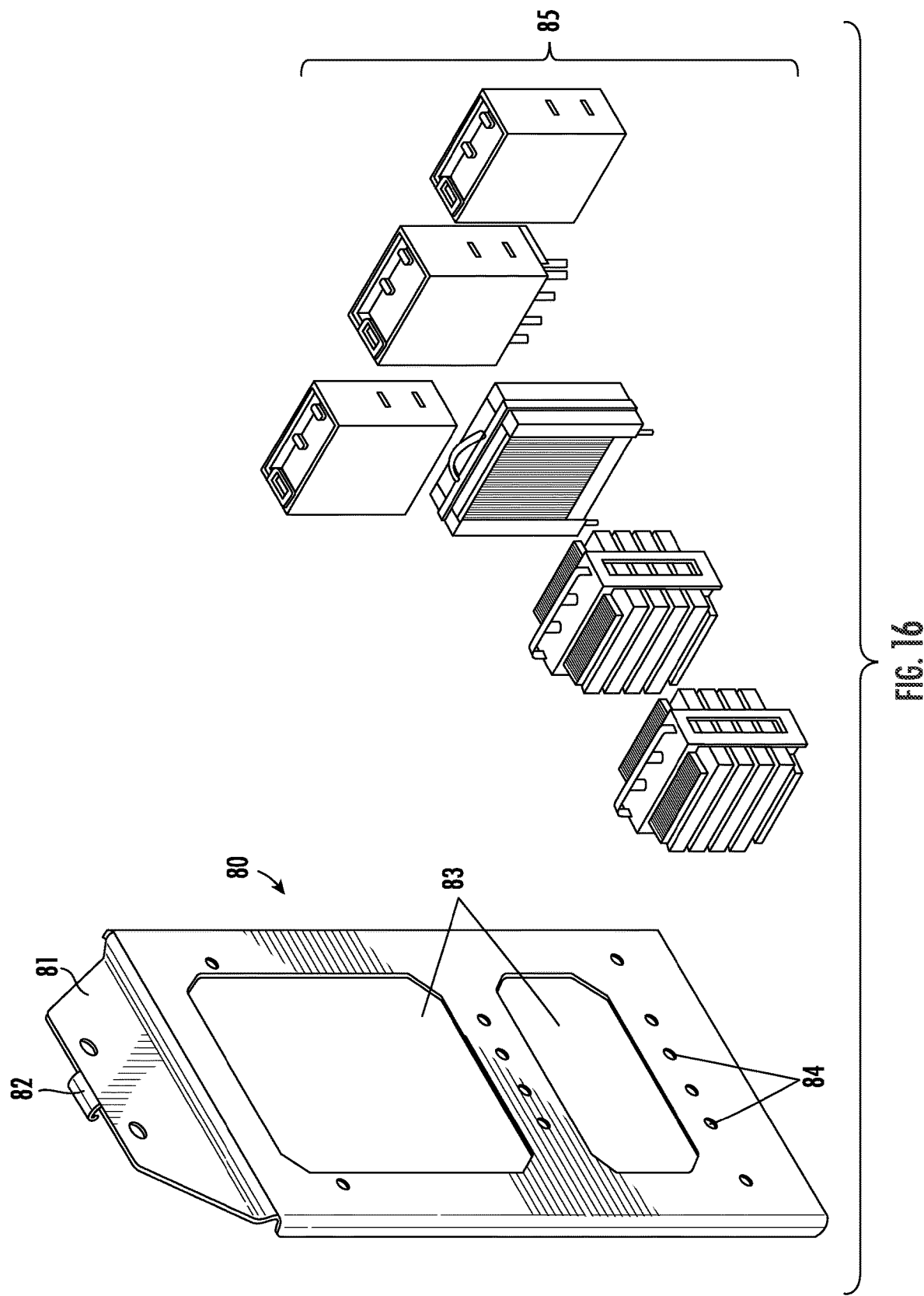
FIG. 16 is a front view of an alternative hanger plate to be used with multiple models of radios in the enclosure of FIG. 1.

Alternatively, and as illustrated in FIGS. 16 and 17, another mounting bracket 80 may be employed to mount a different line of radios 85 (e.g., Ericsson radios). The mounting bracket 80 is generally flat, with an offset upper flange 81 that has a hook 82 on its upper edge. The mounting bracket 80 may include areas 83 that are perforated or cut out entirely. The bracket 80 also has mounting holes 84. As shown in FIG. 17, the radio 85 may first be mounted to the bracket 80 via fasteners inserted into the holes 84, then the bracket 80 can be hung on a mounting blade 50 by simply inserting the hook 82 into the one of the cutouts 56 in the slot 54 of the mounting blade 50 and sliding the hook 82 within the slot 54 to a desired location.

Figure 18A:
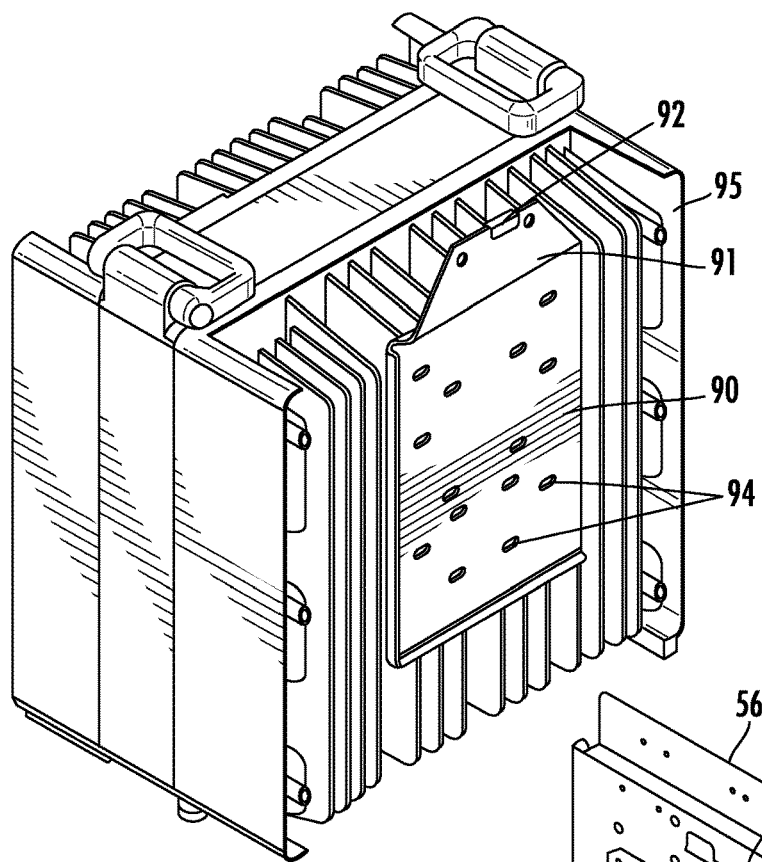
FIG. 18A is a perspective view of another radio and hanger plate to be used in the enclosure of FIG. 1.
Figure 18B:
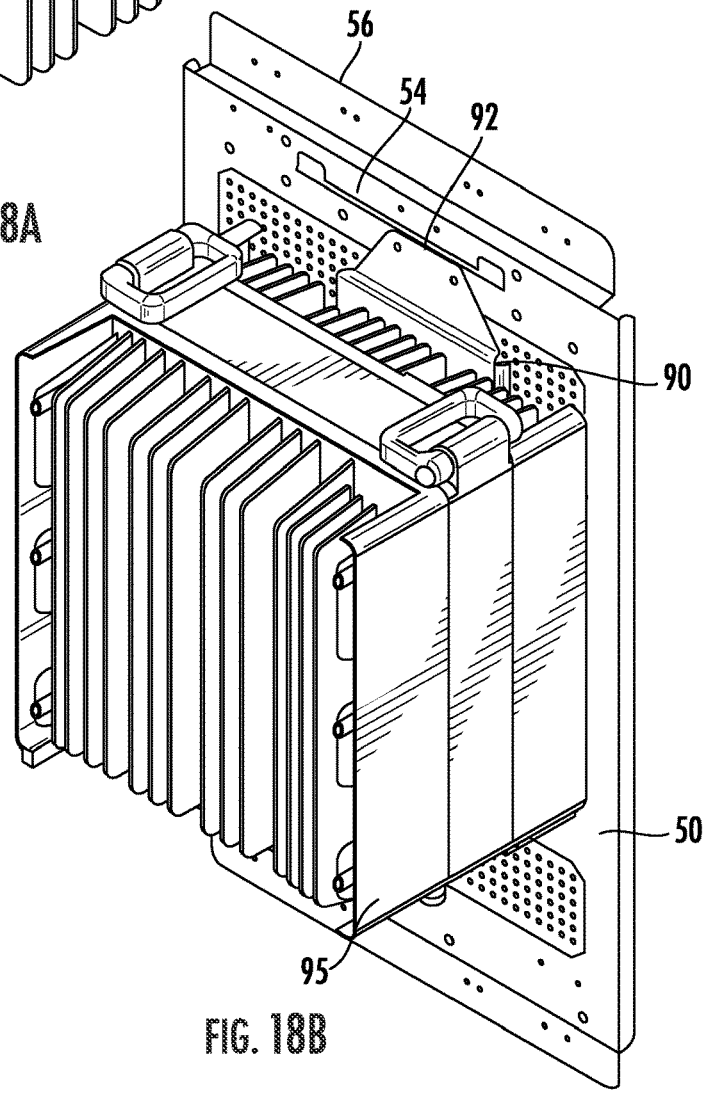
FIG. 18B is a perspective view of the radio and hanger plate of FIG. 18A mounted on a mounting blade.

As a further alternative, FIGS. 18A and 18B illustrate still another mounting bracket 90 that may be employed to mount a different radio 95 (e.g., a Samsung radio). The mounting bracket 90 is generally flat, with an offset upper flange 91 that has a hook 92 on its upper edge. The bracket 90 also has mounting holes 84. As shown in FIG. 18B, the radio 95 may first be mounted to the bracket 90 via fasteners inserted into the holes 94, then, in the manner described above, the bracket 90 can be hung on a mounting blade 50 by simply inserting the hook 92 into the one of the cutouts 56 in the slot 54 of the mounting blade 50 and sliding the hook 92 within the slot 54 to a desired location.

Figure 19:
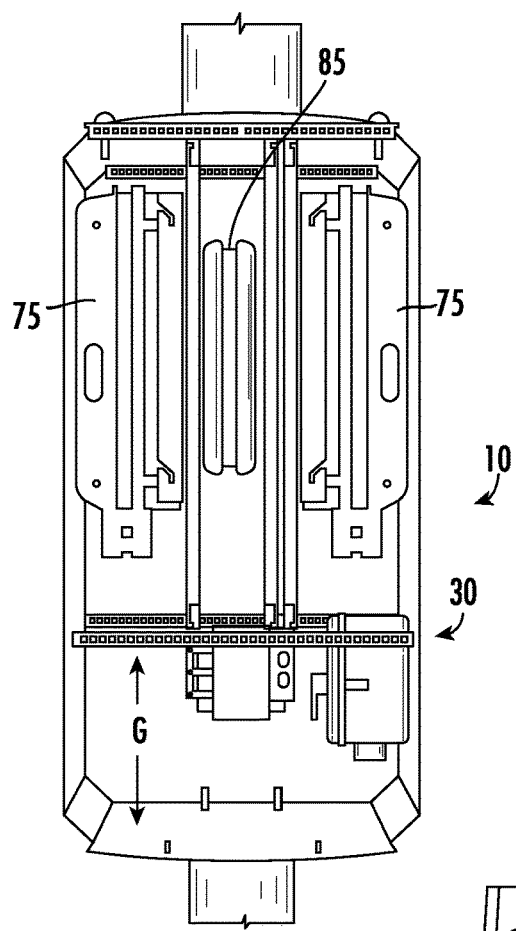
FIG. 19 is a front view of the enclosure of FIG. 1 with two radios, a rectifier, a diplexer and a power disconnect mounted therein.
Figure 20:
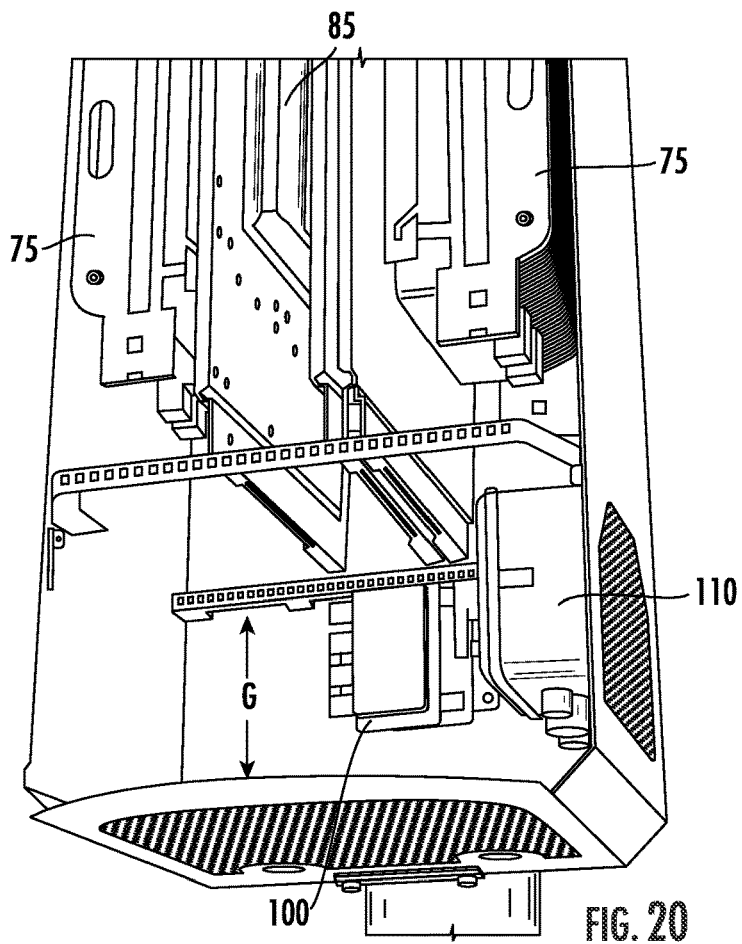
FIG. 20 is an enlarged, partial front perspective view of the enclosure and equipment in FIG. 19.

FIGS. 19 and 20 illustrate the enclosure 10 with two radios 75 and one radio 85 installed therein. As shown in the figures, each of the three radios 75, 85 is mounted on an extendable mounting blade 50, with the radios 75 being mounted via a respective mounting bracket 70 and the radio 85 being mounted via a mounting bracket 80. Also, FIGS. 19 and 20 illustrate that the foundation 30 is mounted well above the floor 16, creating a gap G (which may be between about 10 and 17 inches in height) in which additional equipment, such as a diplexer 100 and a power supply 110, may be mounted. Additional equipment may also be mounted on one of the mounting blades 50. Different alternatives are described below.

Figure 21:
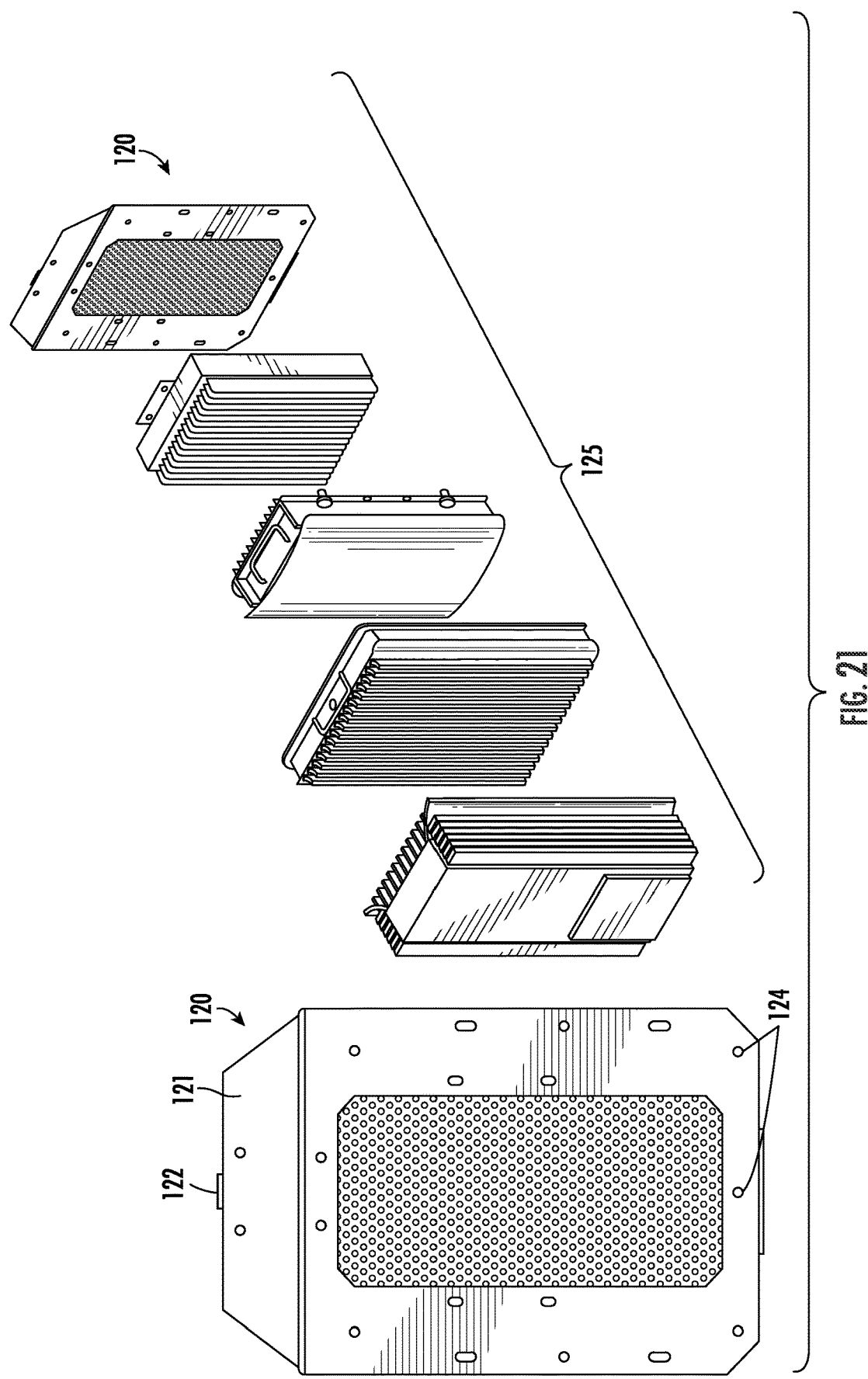
FIG. 21 is a side view of a hanger plate for mounting a variety of different rectifiers in the enclosure of FIG. 1.

FIG. 21 shows a mounting bracket 120 that can be employed with a rectifier 125. The mounting bracket 120 is similar to the mounting bracket 90; it is generally flat, with an offset upper flange 121 that has a hook 122 on its upper edge. The bracket 120 also has mounting holes 124 around a cutout or perforated area 123. As suggested by FIG. 21, the rectifier 125 may first be mounted to the bracket 120 via fasteners inserted into the holes 124, then, in the manner described above, the bracket 120 can be hung on a mounting blade 50 by simply inserting the hook 122 into the one of the cutouts 56 in the slot 54 of the mounting blade 50 and sliding the hook 122 within the slot 54 to a desired location.

Figure 22:
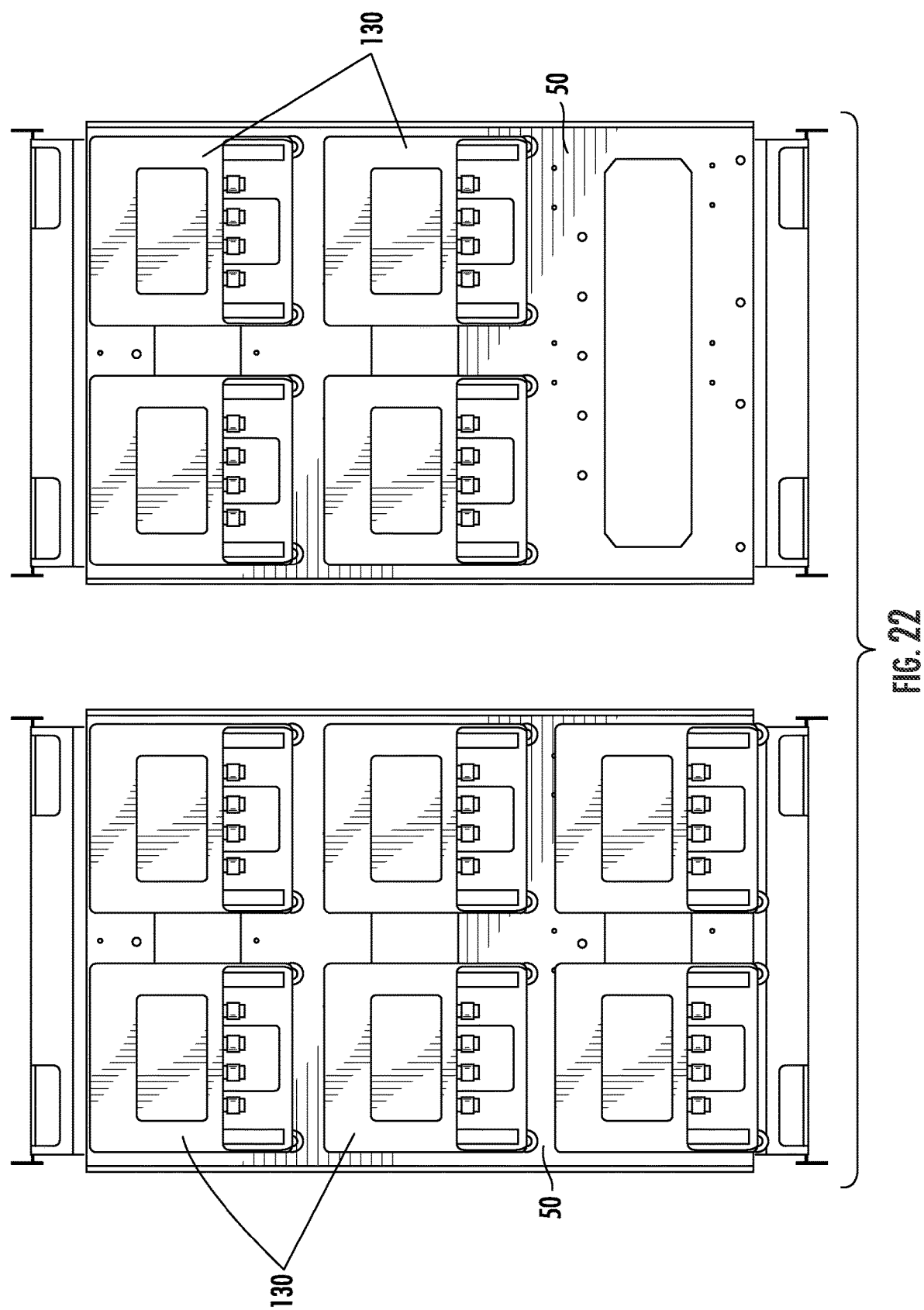
FIG. 22 is a side view of equipment mounted directly to a mounting blade of FIG. 9.
Figure 23:
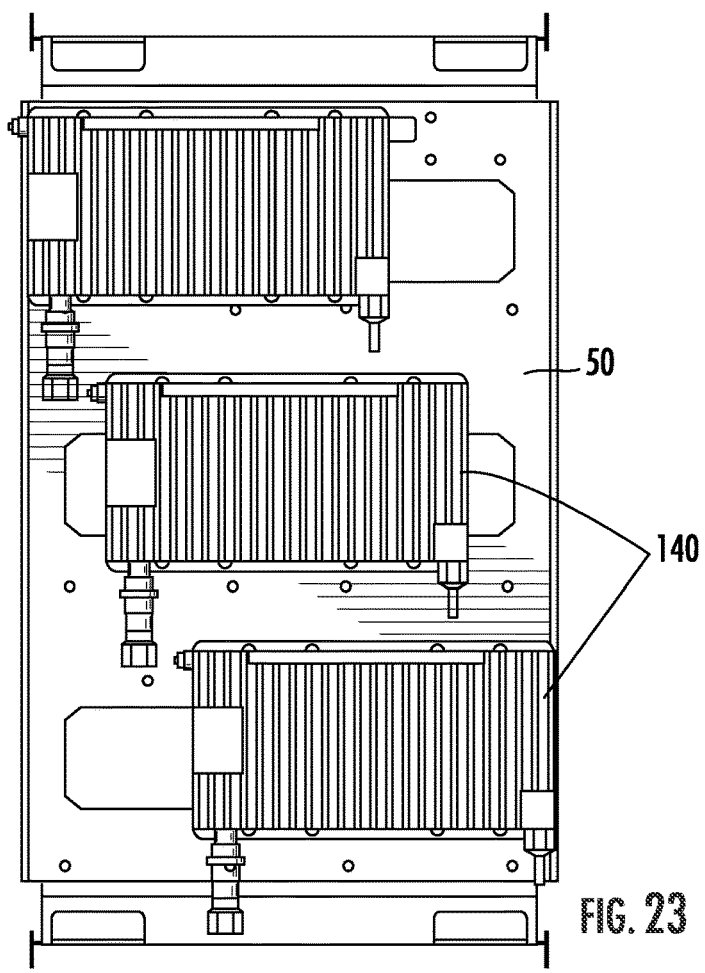
FIG. 23 is a side view of power supply units mounted directly to a mounting blade of FIG. 9.

FIGS. 22 and 23 illustrate how equipment can be mounting directed to a mounting blade 50. FIG. 22 illustrates the mounting of an RRU (Remote Radio Unit) 130 on the mounting blade 50, and FIG. 23 illustrates the mounting of power supply units 140. In each instance the equipment 130, 140 can be mounted with fasteners inserted into the existing holes 57 in the mounting blade 50.

Figure 24:
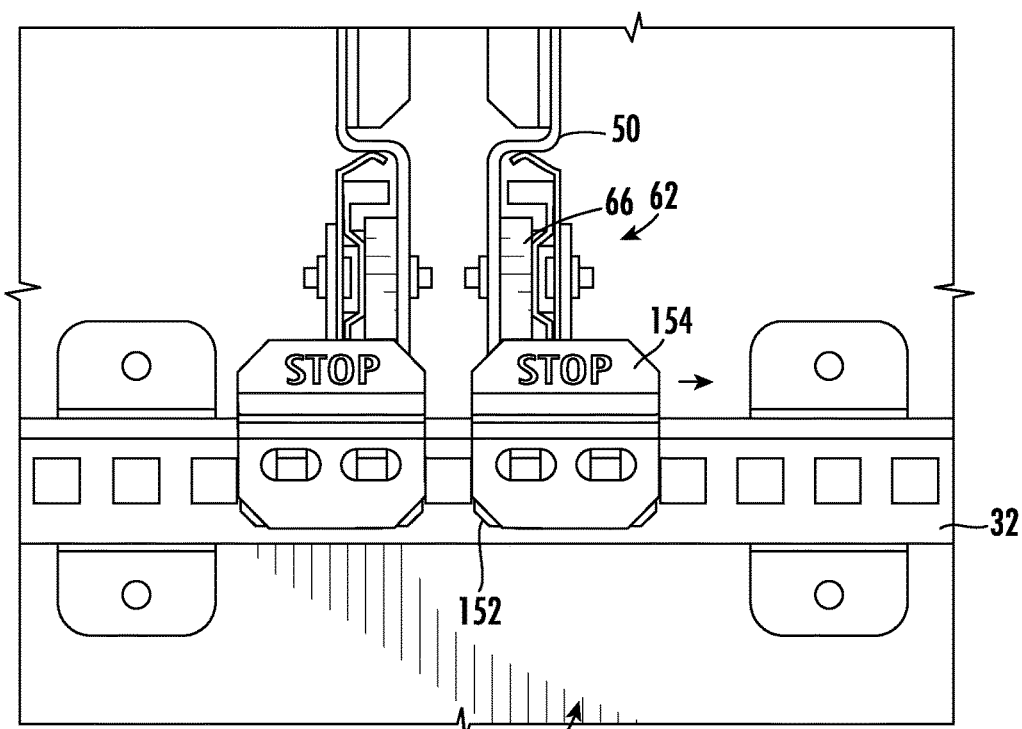
FIG. 24 is a front view of a locking mechanism to maintain mounting blades in a retracted position in the enclosure of FIG. 1.

Referring now to FIG. 24, in some embodiments it may be desirable to provide a mechanism that locks each mounting blade 50 in the retracted position and can be released to allow the mounting blade 50 to move to the extended position. FIG. 24 illustrates a slide mechanism 150 that includes a fixed member 152 that is fixed to the front cross-member 32 and a sliding member 154 that extends above and can slide laterally relative to the fixed member 152. The sliding member 154 takes the position shown in FIG. 24 to maintain the mounting blade 50 in the retracted position. The sliding member 154 can be slid sideways (parallel to the front cross-member 32) to move it out of the way of the slide member 66 of the slide rail 62, enabling the slide member 66 and mounting blade 50 with any attached equipment to move to the extended position. In some embodiments, the sliding member 154 may be spring-biased toward the locking position of FIG. 24, or it may be maintained in either of its positions relative to the fixed member via friction; detents, or the like.

Figure 25:
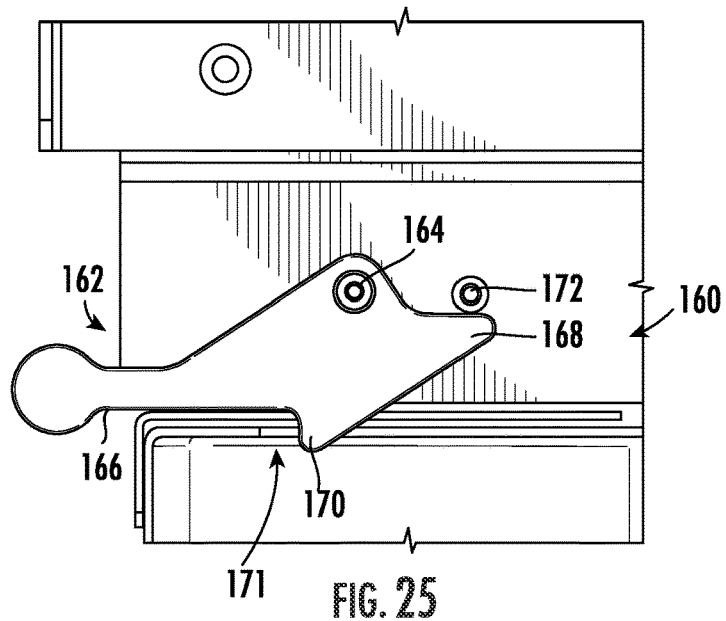
FIGS. 25-27 are side views of an alternative locking mechanism for maintaining the mounting blades in a retracted position.
Figure 26:
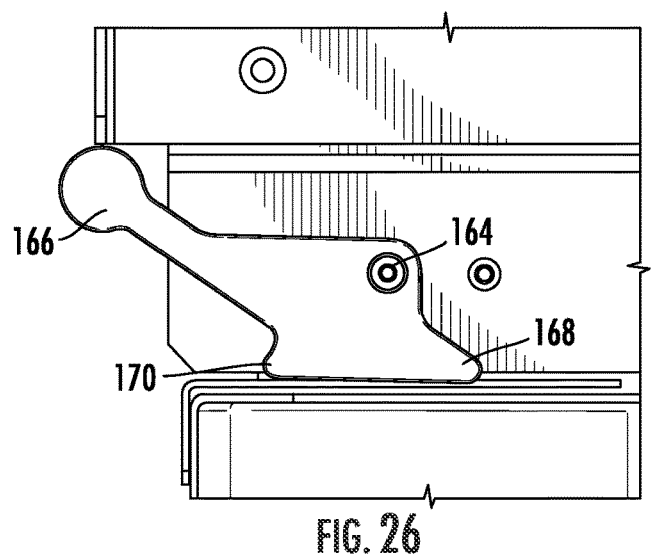
Figure 27:
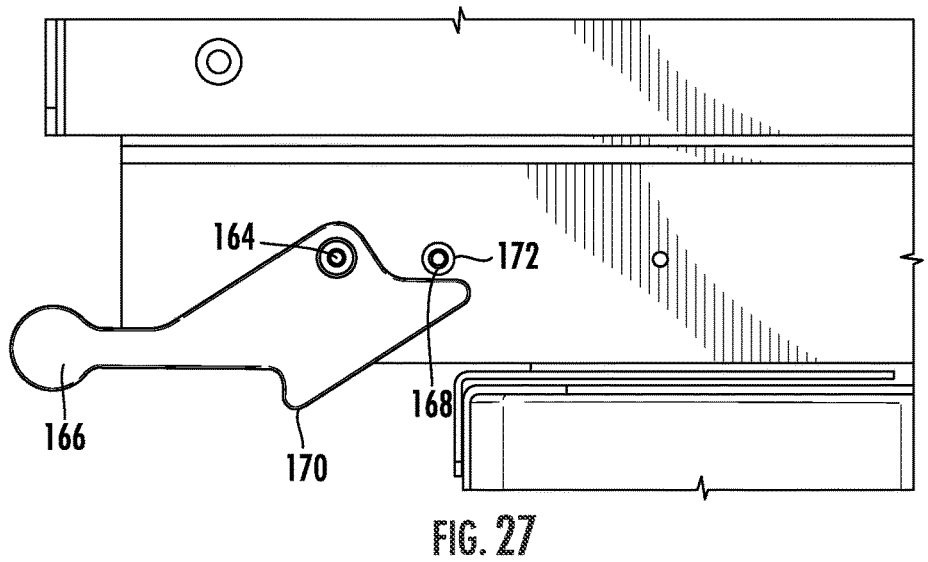

Referring now to FIGS. 25-27, another locking mechanism, designated at 160, is shown therein. The locking mechanism 160 includes a locking lever 162 that is pivotally attached to the slide member 66 at a pivot 164. The locking lever 162 includes a handle 166, an angled nose 168, and a nub 170. As shown in FIG. 25, in the locked position, the handle 166 is generally horizontal, the nub 170 fits within a notch 171 in the stationary member 64, and the nose 168 is raised to engage a post 172 mounted to the slide member 66. In this position, the mounting blade 50 is locked in the retracted position. To unlock the mounting blade 50, a technician pulls upwardly on the handle 166, which causes the locking lever 162 to rotate about the pivot 164 (see FIG. 26). The nub 170 disengages from the notch 171, thereby allowing the slide member 66 and the mounting blade 50 to slide to the extended position. When the mounting blade 50 is to be returned to its locked position, as shown in FIG. 27 the locking lever 162 is returned to the orientation of FIG. 25 (this can be done manually or automatically, for example, via spring loading or simply gravity), and the mounting blade 50 is pushed back toward the retracted position. The lower surface of the locking lever 162 contacts the front edge of the stationary member 64, which temporarily pivots the locking lever 162 to the orientation of FIG. 26; once the nub 170 reaches the notch 171, the locking lever 162 pivots back to its locking orientation of FIG. 25.

Those of skill in this art will appreciate that, in some embodiments, a locking mechanism such as those discussed herein may be positioned and configured so that the mounting blade and equipment mounted thereon may take an extended position in which the mounting blade 50 is only partially positioned in front of the enclosure.

As another variation, in some embodiments (for example, when a piece of equipment is particularly heavy), the equipment may be mounted to two adjacent mounting blades 50, each mounted on its own slide member 66, so that the equipment is supported by both slide members 66.

The invention being thus described, it will be apparent that the same may be varied in many ways. Such variations are not to be regarded as a departure from the spirit and scope of the invention, and all such modifications as would be obvious to one skilled in the art are to be included within the scope of the following claims.

That which is claimed is:

1. An electronics enclosure, comprising:
a housing having a floor, a ceiling, a rear wall, a pair of side walls, and a door mounted to one of the side walls that define an internal cavity, the housing configured to be mounted to a mounting structure;
a first vertically-disposed mounting blade, the first mounting blade being planar having a first mounting surface and an opposing second mounting surface;
first electronic equipment mounted on one of the mounting surfaces of the first mounting blade; and
a first sliding mechanism mounted to the housing and comprising an upper slide rail comprising an upper stationary member and an upper slide member, and a lower slide rail comprising a lower stationary member and a lower slide member;
wherein the first mounting blade is mounted to the first slide member of the upper slide rail and the second side member of the lower slide rails, the first stationary member of the upper slide rail and the second stationary member of the lower slide rail are fixed relative to the housing, and the first sliding mechanism is configured to permit the first mounting blade, and the first electronic equipment mounted thereon, to move along a direction parallel to the blade between a retracted position, in which the first mounting blade is positioned in the internal cavity, and an extended position, in which the first mounting blade is positioned forwardly of the internal cavity to facilitate access to the first electronic equipment.

2. The enclosure defined in claim 1, further comprising:
a second vertically-disposed mounting blade, the second mounting blade being planar having opposing mounting surfaces;
second electronic equipment mounted on one of the mounting surfaces of the second mounting blade; and
a second sliding mechanism mounted to the housing and to the second mounting blade.

3. The enclosure defined in claim 1, wherein the door has an arcuate profile.

4. The enclosure defined in claim 1, wherein the first sliding mechanism is mounted in the housing such that a gap having a height of between about 10 and 17 inches is present between the floor and the first sliding mechanism.

5. The enclosure defined in claim 4, wherein a power supply and/or a diplexer is mounted in the gap.

6. The enclosure defined in claim 1, further comprising a first mounting bracket, the first mounting bracket being mounted to the first mounting blade, and the first electronic equipment being mounted to the first mounting bracket.

7. The enclosure defined in claim 6, wherein the first mounting bracket is mounted on the first mounting blade with fasteners inserted into mounting holes in the first mounting blade.

8. The enclosure defined in claim 6, wherein the first mounting bracket includes a hook on an upper edge thereof, and the first mounting bracket is mounted on the first mounting blade with a hook.

9. The enclosure defined in claim 1, further comprising a locking mechanism that releasably locks the first mounting blade in the retracted position.

10. The enclosure defined in claim 1, in combination with a mounting structure, the enclosure mounted on the mounting structure so that the floor is above ground.

11. The enclosure defined in claim 1, wherein the electronic equipment remains externally electrically connected in both the retracted position and the extended positions.

12. The enclosure defined in claim 1, wherein in the extended position, the first mounting blade remains mounted to the first sliding mechanism.

13. An electronics enclosure, comprising:
a housing having a floor, a ceiling, a rear wall, a pair of side walls, and a door mounted to one of the side walls that define an internal cavity;
a bracket mounted to the rear wall of the housing, the bracket configured to mount the electronics enclosure to a mounting structure;
two cross-members residing within the internal cavity;

a first vertically-disposed mounting blade, wherein the first mounting blade is planar;

a second vertically-disposed mounting blade, wherein the second mounting blade is planar and mounted parallel to the first mounting blade;

first electronic equipment mounted on the first mounting blade;

second electronic equipment mounted on the second mounting blade;

a first sliding mechanism comprising upper and lower first stationary members mounted to each cross-member and upper and lower first slide members mounted to the first mounting blade, the upper and lower first stationary members of the first sliding mechanism are fixed relative to each cross-member and configured to permit the upper and lower first slide members mounted to the first mounting blade, the first mounting blade, and the first electronic equipment mounted thereon, to move along a direction parallel to the blade between a retracted position, in which the first mounting blade is positioned in the internal cavity, and an extended position, in which the first mounting blade is positioned forwardly of the internal cavity to facilitate access to the first electronic equipment; and a second sliding mechanism comprising upper and lower second stationary members mounted to each cross-member and upper and lower second slide members mounted to the second mounting blade, the upper and lower second stationary members of the second sliding mechanism are fixed relative to each cross-member and configured to permit the upper and lower second slide members mounted to the second mounting blade, the second mounting blade, and the second electronic equipment mounted thereon, to move along a direction parallel to the blade between a retracted position, in which the second mounting blade is positioned in the internal cavity, and an extended position, in which the second mounting blade is positioned forwardly of the internal cavity to facilitate access to the second electronic equipment.

14. The enclosure defined in claim 13, wherein the door has an arcuate profile.

15. The enclosure defined in claim 13, wherein the first and second sliding mechanisms are mounted in the housing such that a gap having a height of between about 10 and 17 inches is present between the floor and the first and second sliding mechanisms.

16. The enclosure defined in claim 13, further comprising (a) a first mounting bracket, the mounting bracket being mounted to the first mounting blade, and the first electronic equipment being mounted to the first mounting bracket, and (b) a second mounting bracket, the second mounting bracket being mounted to the second mounting blade, and the second electronic equipment being mounted to the second mounting bracket.

17. The enclosure defined in claim 16, wherein the first mounting bracket is mounted on the first mounting blade with fasteners inserted into mounting holes in the first mounting blade via the hook being inserted into a slot in the first mounting blade.

18. The enclosure defined in claim 16, wherein the first mounting bracket includes a hook on an upper edge thereof, and the first mounting bracket is mounted on the first mounting blade with a hook.

19. The enclosure defined in claim 13, further comprising a first locking mechanism that releasably locks the first mounting blade in the retracted position.

20. An electronics enclosure, comprising:

a housing having a floor, a ceiling, a rear wall, a pair of side walls, and a door mounted to one of the side walls that define an internal cavity;

a bracket mounted to the rear wall of the housing, the bracket configured to mount the electronics enclosure to a mounting structure;

a first vertically-disposed mounting blade, wherein the first mounting blade is planar;

a second vertically-disposed mounting blade, wherein the second mounting blade is planar and mounted parallel to the first mounting blade;

first electronic equipment mounted on the first mounting blade;

second electronic equipment mounted on the second mounting blade;

a first sliding mechanism comprising first stationary members mounted to the housing and first slide members mounted to the first mounting blade, the first stationary members are fixed relative to the housing and the first slide members are configured to permit the first mounting blade, and the first electronic equipment mounted thereon, to move along a direction parallel to the blade between a retracted position, in which the first mounting blade is positioned in the internal cavity, and an extended position, in which the first mounting blade is positioned forwardly of the internal cavity to facilitate access to the first electronic equipment;

a second sliding mechanism comprising second stationary members mounted to the housing and second slide members mounted to the second mounting blade, the second stationary members are fixed relative to the housing and the second slide members are configured to permit the second mounting blade, and the second electronic equipment mounted thereon, to move along a direction parallel to the blade between a retracted position, in which the second mounting blade is positioned in the internal cavity, and an extended position, in which the second mounting blade is positioned forwardly of the internal cavity to facilitate access to the second electronic equipment;

a first locking mechanism that releasably locks the first mounting blade in the retracted position and prevent outward movement; and a second locking mechanism that releasably locks the second mounting blade in the retracted position and prevent outward movement.

* * * * *